(12) United States Patent
Sun

(10) Patent No.: US 6,507,475 B1
(45) Date of Patent: Jan. 14, 2003

(54) CAPACITIVE DEVICE AND METHOD OF MANUFACTURE

(75) Inventor: Xi-Qing Sun, Gilbert, AZ (US)

(73) Assignee: Motorola, Inc., Schaumburg, IL (US)

( * ) Notice: Subject to any disclaimer, the term of this patent is extended or adjusted under 35 U.S.C. 154(b) by 14 days.

(21) Appl. No.: 09/604,626

(22) Filed: Jun. 27, 2000

(51) Int. Cl.$^7$ .............................. H01G 7/00; H01G 5/00
(52) U.S. Cl. ........................................ 361/281; 361/277
(58) Field of Search ................................ 361/277–278, 361/280–281, 287, 290

(56) References Cited

U.S. PATENT DOCUMENTS

| | | | | |
|---|---|---|---|---|
| 5,644,349 A | * | 7/1997 | Martin | 347/46 |
| 5,880,921 A | | 3/1999 | Tham et al. | 361/233 |
| 6,057,520 A | * | 5/2000 | Goodwin-Johansson | 200/181 |
| 6,212,056 B1 | * | 4/2001 | Gammel et al. | 361/277 |
| 6,229,684 B1 | * | 5/2001 | Cowen et al. | 361/277 |

OTHER PUBLICATIONS

D. Young et al., Department of EECS, University of California, "A Micromachined Variable Capacitor for Monolithic Low–Noise VCOS", Solid–state Sensor and Actuator Workshop, Hilton, Head, South Carolina, Jun. 2–6, 1996, pp. 86–89.

J. Yao et al., Rockwell Science Center, "High Tuning–Ratio MEMS–Based Turnable Capacitors for RF Communications Applications", Solid–State Sensor and Actuator Workshop, Hilton Head, South Carolina, Jun. 8–11, 1998, pp. 124–127.

\* cited by examiner

*Primary Examiner*—Anthony Dinkins
*Assistant Examiner*—Eric Thomas
(74) *Attorney, Agent, or Firm*—Charles W. Bethards; Mark J. Fink

(57) ABSTRACT

A capacitive device includes a substrate (110), a first electrode (130, 140, 1220) located over the substrate and a second electrode (170, 1070, 1071, 1250) located over the first electrode, movable relative to the first electrode, and capacitively coupled to the first electrode. The device further includes a first control electrode (120, 150, 1210) located over the substrate and a second control electrode (160, 180, 1060, 1061, 1080, 1081, 1240) located over the first control electrode, movable relative to the first control electrode, and capacitively coupled to the first control electrode. The first and second control electrodes actuate the second electrode toward the first electrode.

12 Claims, 6 Drawing Sheets

CAPACITIVE DEVICE AND METHOD OF MANUFACTURE

FIELD OF THE INVENTION

This invention relates, in general, to electronics, and more particularly, to capacitive devices and methods of manufacture.

BACKGROUND OF THE INVENTION

Capacitance tuning devices or variable capacitors are used in wireless Radio Frequency (RF) and microwave Integrated Circuits (ICs) for many telecommunication applications. RF and microwave ICs include Voltage-Controlled Oscillators (VCOs), impedance matching circuits, adjustable RF amplifiers, filter tuning circuits, antenna tuning circuits, crystal trimming circuits, and many others. These RF and microwave ICs typically use PN junction semiconductor variable capacitors, commonly referred to as varactor diodes, off-chip mechanically trimmable capacitors, or micro-electromechanical systems (MEMS) variable capacitors.

However, the varactor diodes cannot meet the high speed requirements of the RF and microwave circuits because of the excessive series loss or low quality factor of the varactor diodes. Furthermore, the varactor diodes also cannot meet the wideband wireless communication requirements because of the narrow capacitance tuning range of the varactor diodes. Current wideband frequencies range from approximately 800 MegaHertz (MHz) to 2.5 GigaHertz (GHz). Similarly, the off-chip mechanically trimmable capacitors also have disadvantages including increased cost, increased component size, and reduced reliability. Additionally, the MEMS variable capacitors also have drawbacks including the lack of RF isolation, the lack of direct current (DC) and alternating current (AC) isolation, sensitivity to microphonics, sensitivity to electrical disturbances, sensitivity to temperature changes, and many others.

Accordingly, a need exists for a capacitive device and a method of manufacturing that is compatible with RF and microwave IC applications and that can also satisfy wideband communication requirements.

BRIEF DESCRIPTION OF THE DRAWINGS

The invention will be better understood from a reading of the following detailed description, taken in conjunction with the accompanying drawing figures in which.

Figure 1:
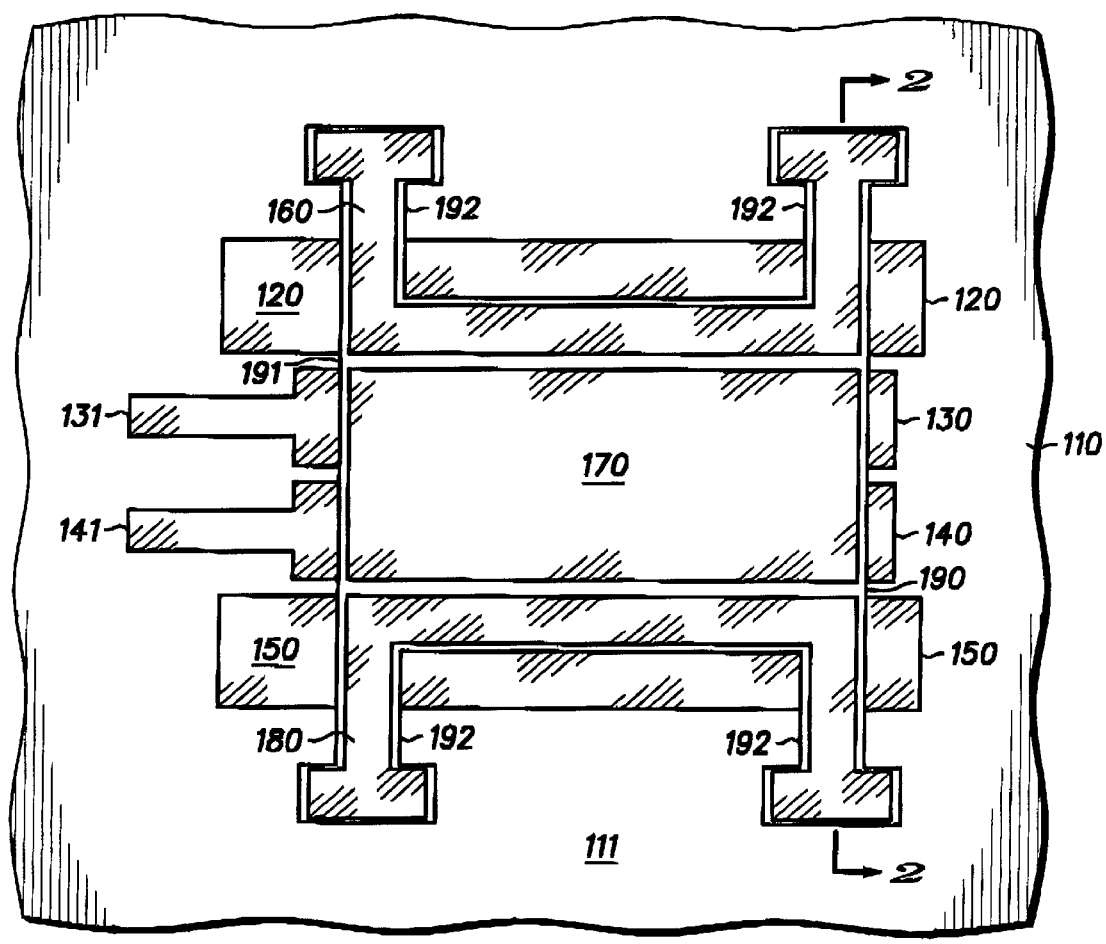
FIG. 1 illustrates a top view of a first capacitive device in accordance with an embodiment of the invention.

For simplicity and clarity of illustration, the drawing figures illustrate the general manner of construction, and descriptions and details of well-known features and techniques are omitted to avoid unnecessarily obscuring the invention. Additionally, elements in the drawing figures are not necessarily drawn to scale, and the same reference numerals in different figures denote the same elements.

Furthermore, the terms first, second, third, fourth, and the like in the description and in the claims, if any, are used for distinguishing between similar elements and not necessarily for describing a sequential or chronological order. It is further understood that the terms so used are interchangeable under appropriate circumstances and that the embodiments of the invention described herein are capable of operation in sequences other than those described or illustrated herein.

Moreover, the terms top, bottom, over, under, and the like in the description and in the claims, if any, are used for descriptive purposes and not necessarily for describing relative positions. It is understood that the terms so used are interchangeable under appropriate circumstances and that the embodiments of the invention described herein are capable of operation in other orientations than described or illustrated herein.

DETAILED DESCRIPTION OF THE DRAWINGS

Figure 2:
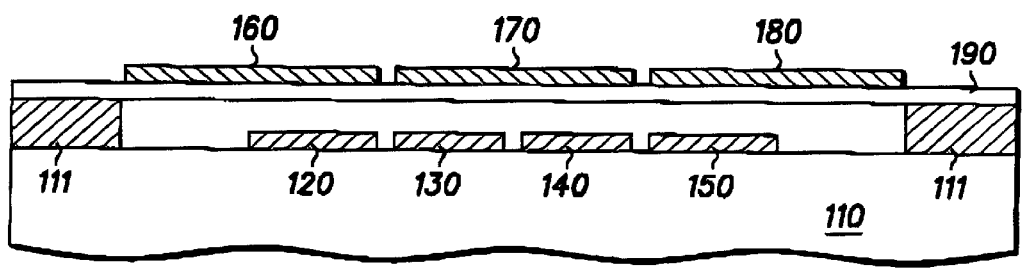
FIG. 2 illustrates a cross-sectional view of the first capacitive device of FIG. 1, taken along a section line 2—2 in FIG. 1, in accordance with an embodiment of the invention.

FIG. 1 illustrates a top view of a capacitive device 100. FIG. 2 illustrates a cross-sectional view of device 100, taking along a section line 2—2 in FIG. 1. Device 100 is illustrated to include a capacitor, but device 100 can also include other components such as transistors, resistors, and inductors to form an IC. The capacitance of the capacitor in device 100 is variable and can be tuned to different levels. In the preferred embodiment, the capacitance of the capacitor in device 100 is tuned only to two discrete levels or states. Accordingly, the capacitor in device 100 preferably forms a digital switch.

Device 100 comprises a substrate 110 having a surface 111. Device 100 also comprises electrodes 120, 130, 140, and 150 located over surface 111 of substrate 110. Electrode 130 is located adjacent to and between electrodes 120 and 140, and electrode 140 is located adjacent to and between electrodes 130 and 150. Electrodes 130 and 140 are both electrically isolated from electrodes 120 and 150. Similarly, electrodes 120 and 150 are both electrically isolated from electrodes 130 and 140. The electrical isolation provides substantial DC, AC, and RF isolation, but does not necessarily provide electrical isolation from all parasitic electrical effects. In one embodiment, electrodes 120 and 150 can be electrically coupled together.

Device 100 further comprises electrodes 160, 170, and 180. Electrode 160 is located directly over electrode 120 and is movable relative to electrode 120. Electrode 170 is located directly over electrodes 130 and 140, located adjacent to and between electrodes 160 and 180, and movable relative to electrodes 130 and 140. Electrode 180 is located directly over electrode 150 and is movable relative to electrode 150.

Electrode 160 is electrically isolated from the other electrodes of device 100, but is capacitively coupled to electrode 120. Similarly, electrode 180 is electrically isolated from the other electrodes of device 100, but is capacitively coupled to electrode 150. Electrode 170 is also electrically isolated from the other electrodes of device 100, but is capacitively coupled to both of electrodes 130 and 140.

Device 100 additionally comprises an electrically insulative layer 190. Layer 190 is located between electrodes 120 and 160, between electrodes 170 and 130, between electrodes 170 and 140, and between electrodes 150 and 180. Layer 190 supports electrode 160 over electrode 120, supports electrode 170 over electrodes 130 and 140, and supports electrode 180 over electrode 150.

In the preferred embodiment, the capacitor of device 100 has a three-plate digital capacitor structure. Electrodes 130, 140, and 170 form the three-plate digital capacitor structure, and electrodes 120 and 160 and electrodes 150 and 180 control the capacitance of the three-plate digital capacitor structure. Electrodes 130 and 170 form a first coherent capacitor, and electrodes 140 and 170 form a second, but identical, coherent capacitor. The two coherent capacitors are connected serially with each other through electrode 170, which serves as a common plate for both of the two coherent capacitors. Therefore, electrodes 130, 170, and 140 form two capacitors in series, and electrodes 130 and 140 are capacitively coupled to each other through electrode 170. This embodiment of electrode 170 avoids the difficulty in providing an electrical connection to electrode 170.

An output terminal lead 131 is coupled to electrode 130, and output terminal lead 141 is coupled to electrode 140. Lead 131 and electrode 130 serve as a first signal feed through line, and lead 141 and electrode 140 serve as a second signal feed through line. In the preferred embodiment, electrode 170 remains electrically floating and is not directly electrically biased. Electrodes 120, 130, 140, 150, 160, 170, and 180 are all separately placed to provide DC, AC, and RF isolation for each of the electrodes.

Electrodes 160, 170, and 180 are suspended over substrate 110 by a micro-platform 191 and cantilever springs 192. Platform 191 and springs 192 are formed from electrically insulative layer 190. Portions of springs 192 can also be formed from portions of electrodes 160 and 180. Springs 192 mechanically suspend platform 191 over substrate 110. Springs 192 are illustrated to have a straight configuration, but can also have a bent or folded configuration.

Figure 3:
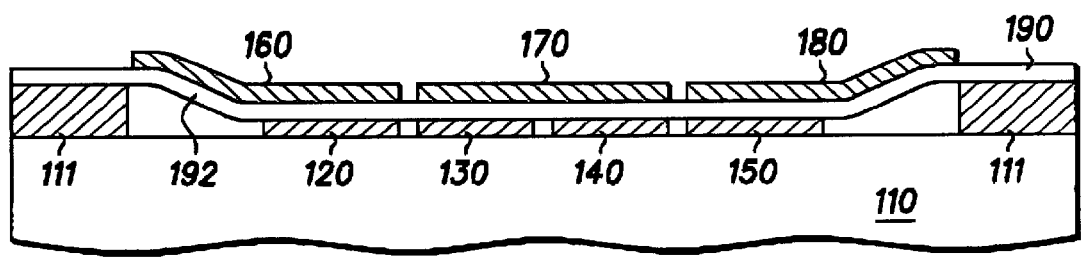
FIG. 3 illustrates a cross-sectional view of the first capacitive device of FIG. 1, taken along a section line 2—2 in FIG. 1, during operation, in accordance with an embodiment of the invention.

FIG. 2 illustrates a cross-sectional view of the capacitor of device 100 during its off-state, and FIG. 3 illustrates a cross-sectional view of the capacitor of device 100 during its on-state. In the preferred embodiment, the capacitor is a digital capacitor and is not operated to have intermediate capacitance values between its on-state and off-state. This operation of the capacitor eliminates the intermediate capacitance values that are sensitive to external disturbances such as mechanical vibrations, voltage variation, temperature changes, and other-effects. Therefore, the capacitor of device 100 has large, stable, and accurate capacitances during its on- and off-states.

Electrodes 120 and 160 of device 100 form a first control electrode pair, and electrodes 150 and 180 of device 100 form a second control electrode pair. Electrodes 120 and 160 and electrodes 150 and 180 actuate electrode 170 towards electrodes 130 and 140. This actuation moves electrodes 160, 170, and 180 in a first direction to tune a capacitance between electrode 170 and electrodes 130 and 140.

In the preferred embodiment, the capacitance between electrodes 130 and 170 and between electrodes 140 and 170 is tuned to only two discrete states. A gap is located between electrodes 130 and 170 and between electrodes 140 and 170 during a first one of the two discrete states, as illustrated in FIG. 2, and the gap is absent from between electrodes 130 and 170 and electrodes 140 and 170 during a second one of the two discrete states, as illustrated in FIG. 3. In the second one of the two discrete states, layer 190 contacts electrodes 130 and 140.

The two-states of the digital capacitor of device 100 are controlled by an external voltage applied to the control electrode pairs. When the external voltage is low, the capacitor is in its off-state, as illustrated in FIG. 2. For example, as a low external voltage is applied between the two electrode pairs, the two-state digital capacitor has an air gap between electrode 170 and electrodes 130 and 140. However, when the external voltage is high, the capacitor is in its on-state, as illustrated in FIG. 3. For example, as a high external voltage or a voltage greater than a threshold voltage is applied between the two control electrode pairs, springs 192 mechanically deflect, and micro-platform 191 is pulled towards electrodes 130 and 140 to provide the on-state capacitance. Springs 192 are preferably relatively soft such that platform 191 remains substantially flat during the on-state of the capacitor, as illustrated in FIG. 3. This preferred embodiment enables a plane-to-plane physical contact between electrode 170 and electrodes 130 and 140. Accordingly, in the on-state, the air gap between electrode 170 and electrodes 130 and 140 disappears, and electrically insulative layer 190 serves as the only capacitor dielectric.

The off-state air gap is preferably greater than the thickness of electrically insulative layer 190 so that the off-state capacitance can be approximated as zero when compared to the much larger on-state capacitance. As an example, if the air gap has a height of approximately four micrometers and if layer 190 has a thickness of approximately 0.5 micrometers, the on-state to off-state capacitance ratio can be as high as approximately 30. Therefore, the off-state capacitance is almost negligible and can be approximated as zero.

Micro-platform 191 can also be actuated by a thermal drive or a combination of both electrostatic and thermal drives. In a thermal drive embodiment, springs 192 form two separate heater loops. By applying a current through the two heater loops, micro-platform 191 is pulled down or up to provide the two-state capacitance values.

The digital capacitor of device 100 has the following features. First, the digital capacitor is mechanically stable because only two capacitance values are used. Accordingly, this digital capacitor in its on-state has a very strong immunity to external mechanical and electrical disturbances. The off-state of the digital capacitor may be slightly sensitive to micro-phonics, but the variations from micro-phonic disturbances has little contribution to the output capacitance of the off-state when compared to the capacitance value of the on-state. Second, the digital capacitor has high DC, AC, and RF isolation because electrodes 120, 130, 140, 150, 160, 170, and 180 are all electrically insulated from each other. Third, the use of the three-plate capacitive system simplifies the complexity of signal feeding through electrical lines. Fourth, the series resistance of the digital capacitor can be very low, and thus, the capacitor quality factor can be higher than 50 at frequencies of above one GHz. Electrodes 120, 130, 140, 150, 160, 170, and 180 can have a thickness between approximately 0.5 micrometers and 2.0 micrometers to provide the high quality factor. Fifth, the electrostatic actuation mechanism used to hold electrode 170 in the on-state consumes very small amounts of DC power, typically below two microWatts. Most of this DC power consumption is contributed by dielectric leakage current.

Device 100 can be manufactured using a manufacturing technology for Micro-Electromechanical Systems (MEMS). MEMS technology uses semiconductor batch manufacturing processes including film depositions, photolithography, etching, and sacrificial layer surface micromachining, among other processes. The MEMS suspended microstructures are formed after the removal of the sacrificial layer or layers.

Figure 4:
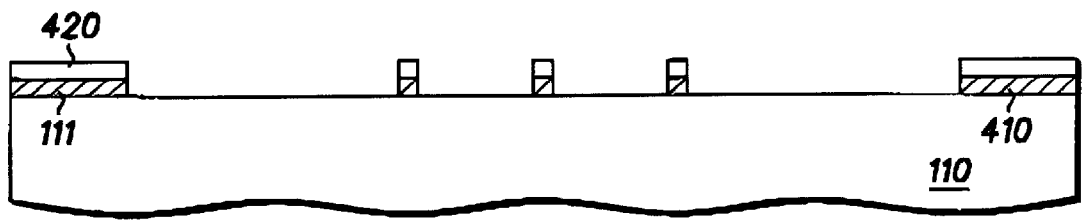
FIGS. 4 through 8 illustrate cross-sectional views of the first capacitive device of FIG. 1 after different steps of a method of manufacturing the first capacitive device in accordance with an embodiment of the invention.

FIGS. 4 through 8 illustrate cross-sectional views of capacitive device 100 after different steps of a method of manufacturing device 100. In FIG. 4, device 100 is illustrated to include substrate 110, which can be comprised of a glass wafer, a ceramic wafer, or a semiconductor wafer, such as silicon or gallium arsenide. Substrate 110 can be comprised of a plurality of layers. In the preferred embodiment, surface 111 of substrate 110 is electrically insulative. A layer 410 of polyimide is coated and soft-baked uniformly over or on surface 111 of substrate 110. Next, a thick layer 420 of photoresist is applied and exposed. Then, layers 420 and 410 are patterned using a Tetra-Methyl-Ammonium-Hydroxide (TMAH) based developer solution to generate a metal lift-off profile.

Figure 5:
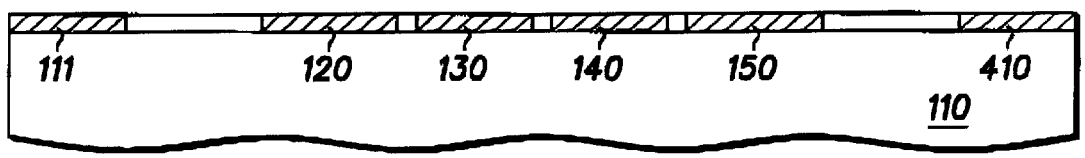

In FIG. 5, a plurality of metal layers such as, for example, titanium and gold, are successively deposited over substrate 110 and layers 410 and 420 and are lifted-off to form electrodes 120, 130, 140, and 150. The lift-off process is performed by stripping off layer 420 (FIG. 4) in an acetone solution. Electrodes 120, 130, 140 and 150 can be comprised of gold, platinum, nickel, aluminum, a silicide, or another highly electrically conductive material.

Figure 6:
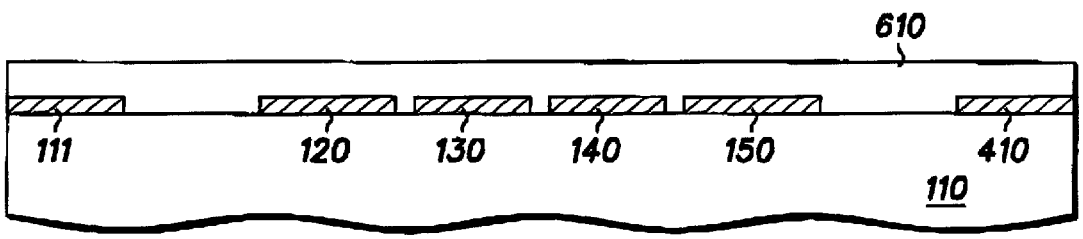

In FIG. 6, a layer 610 comprised of polyimide is coated over electrodes 120, 130, 140, and 150. Next, layer 610 is thermally baked to form a sacrificial layer having a thickness between approximately 1 and 10 micrometers.

Figure 7:
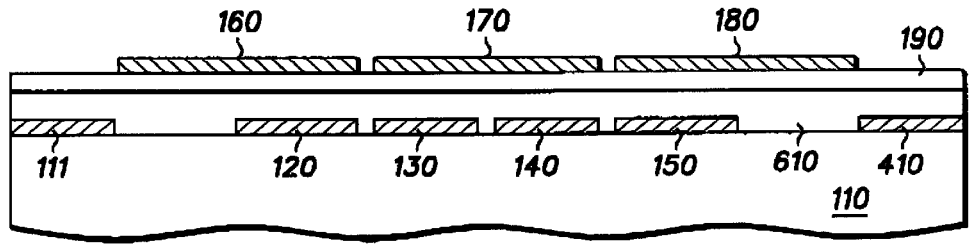

In FIG. 7, layer 190 is deposited to a thickness of approximately 10 angstroms to 3 micrometers. Layer 190 can be comprised of silicon dioxide or silicon nitride. Layer 190 is patterned to form the micro-platform and the springs of the capacitor. Next, a deposition and a lift-off of a metal layer having a thickness of approximately 50 angstroms to 3 micrometers is performed to form electrodes 160, 170, and 180. Electrodes 160, 170, and 180 can be comprised of gold, platinum, nickel, copper, aluminum, a silicide, or another highly electrically conductive material.

Figure 8:
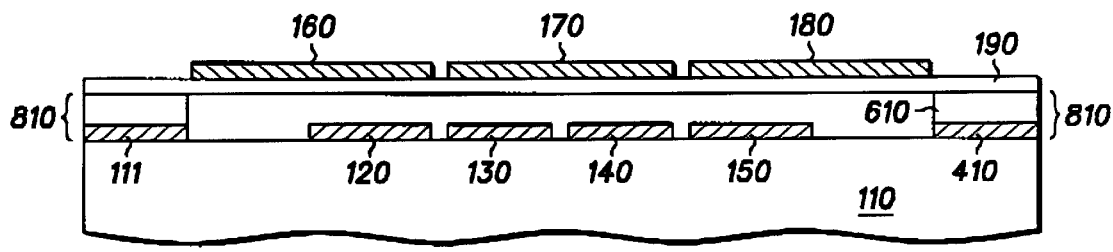

In FIG. 8, the capacitor structure is released by using a time-limited oxygen plasma ashing process to remove portions of layers 610 and 410 under layer 190. Etch holes in layer 190 can be used to reduce the time of the oxygen plasma ashing process. After the ashing process, layer 190 and electrodes 160, 170, and 180 are suspended over electrodes 120, 130, 140, and 150 and surface 111 of substrate 110 by anchors 810 to form the initial off-state capacitance of the capacitor structure. Anchors 810 are designed to be much larger than the undercut of layers 610 and 410 underneath layer 190 during the ashing process so that anchors 810 remain after the ashing process. Anchors 810 are located at opposite sides of electrode 170.

Figure 9:
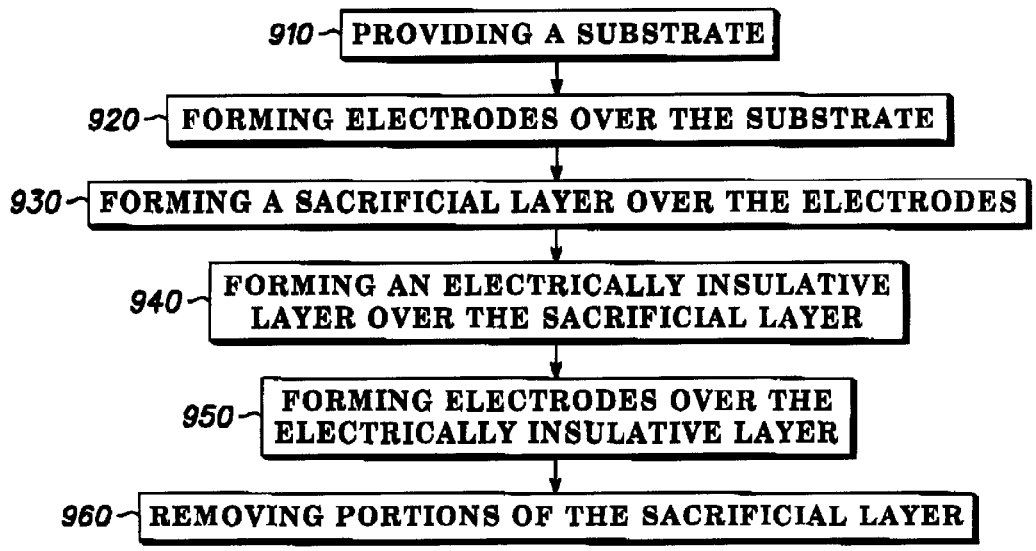
FIG. 9 illustrates a flow chart of the method of manufacturing the first capacitive device in accordance with an embodiment of the invention.

FIG. 9 illustrates a flow chart of a method 900 of manufacturing capacitive device 100, as described earlier with reference to FIGS. 4 through 8. At a step 910 in method 900, a substrate is provided. At a step 920 of method 900, bottom electrodes of capacitive device 100 are formed simultaneously over the substrate. At a step 930, a sacrificial layer is formed over the bottom electrodes and the substrate. At a step 940, an electrically insulative layer is formed over the sacrificial layer, the bottom electrodes, and the substrate. At a step 950, top electrodes of capacitive device 100 are formed simultaneously over the electrically insulative layer, the sacrificial layer, the bottom electrodes, and the substrate. At a step 960 of method 900, at least a portion of the sacrificial layer is removed to release the electrically insulative layer and the top electrodes of capacitive device 100.

Figure 10:
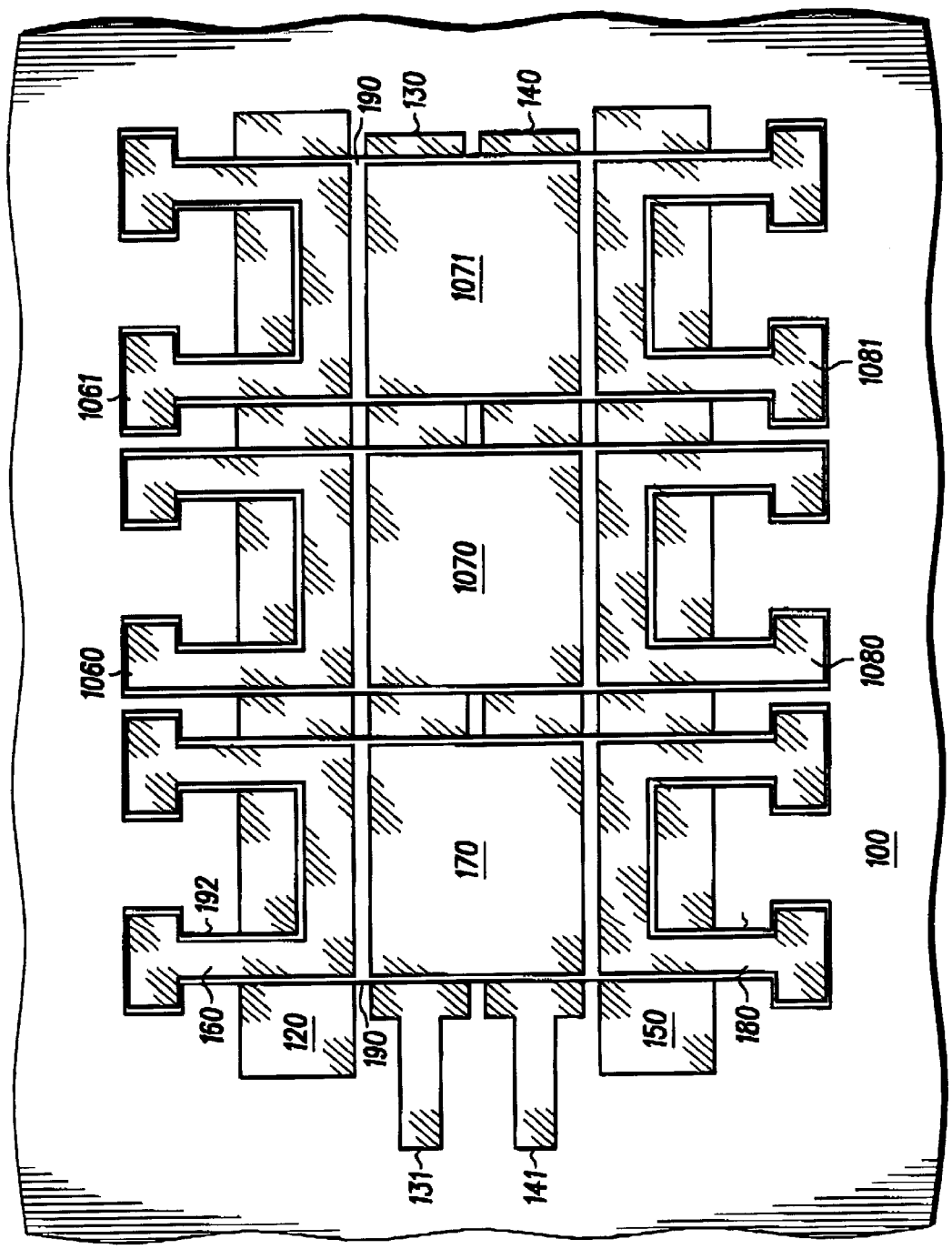
FIG. 10 illustrates a top view of a second capacitive device in accordance with an embodiment of the invention.

FIG. 10 illustrates a top view of a capacitive device 1000, which is a different embodiment of capacitive device 100 in FIG. 1. Device 1000 includes, among other features, the same capacitor structure of device 100, except that electrodes 120, 130, 140, and 150 in device 1000 are longer than electrodes 120, 130, 140, and 150 in device 100. Device 1000 additionally includes a second capacitor structure having electrodes 120, 130, 140, 150, 1060, 1070, and 1080. Electrodes 1060, 1070, and 1080 are similar to electrodes 160, 170, and 180, respectively, except that electrodes 1060, 1070, and 1080 are smaller than electrodes 160, 170, and 180, respectively. Capacitive device 1000 further includes a third capacitor structure comprised of electrodes 120, 130, 140, 150, 1061, 1071, and 1081. Electrodes 1061, 1071, and 1081 are similar to electrodes 1060, 1070, and 1080, respectively, except that electrodes 1061, 1071, and 1081 are smaller than electrodes 1060, 1070, and 1080, respectively. The three capacitors in device 1000 are connected in parallel with each other.

In the preferred embodiment, all three capacitor structures use the same bottom electrodes, but, in an alternative embodiment, each capacitor structure can have separate bottom capacitors that can be electrically coupled together. Electrically insulative layer 190 is separated into three separate portions such that each of the three capacitor structures can move independently of each other. Electrodes 160 and 120 and electrodes 180 and 150 actuate electrode 170 toward electrodes 130 and 140 to tune a capacitance between electrodes 170 and 130 and between electrodes 170 and 140. Electrodes 1060 and 120 and electrodes 1080 and 150 actuate electrode 1070 toward electrodes 130 and 140 to tune a capacitance between electrodes 1070 and 130 and between electrodes 1070 and 140. Electrodes 120 and 1061 and electrodes 150 and 1081 actuate electrode 1071 towards electrodes 130 and 140 to tune a capacitance between electrodes 1071 and 130 and between electrodes 1071 and 140.

The array of capacitor structures in device 1000 have different on-state capacitive values that can be controlled by addressing electronic circuits to produce a wide-range capacitance tuning device. In particular, the three capacitors of device 1000 can be three binary weighted switch capacitors. In this embodiment, electrodes 170, 1070, and 1071 have the same length but have binary weighted widths. For example, electrode 170 can have a first width, and electrode 1070 can have a second width that is half of the first width, and electrode 1071 can have a third width that is a quarter of the first width. Accordingly, the second capacitor structure of device 1000 has a smaller on-state capacitance than the first capacitor structure of device 1000, and the third capacitor structure of device 1000 has a smaller on-state capacitance than the second capacitor structure of device 1000. Furthermore, capacitive device 1000 can provide eight different discrete capacitive values because each of the three capacitor structures can move independently of each other.

Figure 11:
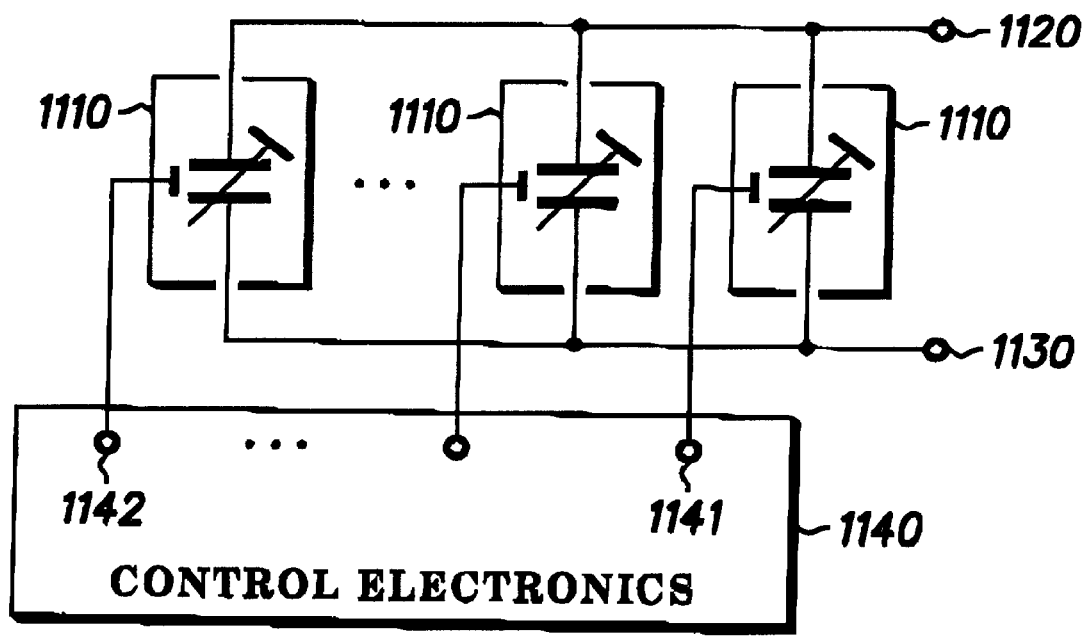
FIG. 11 illustrates a block diagram of a capacitive device in accordance with an embodiment of the invention.

FIG. 11 illustrates a block diagram of a capacitive device 1100. Using the principle of an array of capacitors, a wide range variable digital capacitor device can be formed. This wide range variable digital capacitor device can have N binary weighted digital capacitors 1110 that are connected in parallel with each other where N is a positive integer greater than 1. Device 1100 can be combined with peripheral electronics on the same chip. For example, the combination of nonvolatile memories and device 1100 can provide a nonvolatile variable capacitor chip suitable for many different telecommunications applications.

Electrostatic voltages are supplied through control electronics 1140 to control capacitors 1110 in their on- and off-states. For example, a data bit 1141 in control electronics 1140 can control a first one of capacitors 1110 having the smallest on-state capacitance value, and a data bit 1142 in control electronics 1140 can control a last one of capacitors 1110 having the largest on-state capacitance value. The data bits of control electronics 1140 can be controlled by software or hardware.

Device 1100 has its minimum capacitance when all of the data bits in control electronics 1140 are zero or low. Under this condition, each of capacitors 1110 are in their off-state. As the binary number represented by the data bits in control electronics 1140 increases, the capacitance between nodes 1120 and 1130 increases proportionally.

Device 1100 has its maximum capacitance when each of the data bits in control electronics 1140 are one or high, in which case the total capacitance of capacitors 1110 is $(2^N-1)*C+C_{stray}$ where $C_{stray}$ represents the parasitic capacitances and where C is the minimum capacitance tuning step size. An example of the parasitic capacitances is the lead capacitance, which is typically below 1.0 picoFarads and which contributes to the base capacitance of device 1100. Another example of the parasitic capacitances is the fringe capacitance, which is typically below 1.0 picoFarads and which also contributes to the base capacitance of device 1100. By selecting N capacitors 1110 and the minimum on-state capacitance C, the capacitance tuning range and the step size of device 1100 can be adjusted. The tuning ratio of device 1100 is $(2^N-1)*C/(C_{stray}+1)$.

The maximum output capacitance of device 1100 is related to the number N of capacitors 1110 and increases as N increases if the minimum capacitance tuning step size C remains constant. This relationship implies that the capacitance tuning ratio can be higher than 10 or 20 while the quality factor remains very high at 50 or above. Therefore, device 1100 is a high-performance capacitance tuning device that can be used in voltage-controlled oscillators (VCOs), and the frequency tuning range of device 1100 can cover entire wideband wireless communication spectra ranging from approximately 800 MHz to 2.5 GHz or even higher up to 10 GHz.

Figure 12:
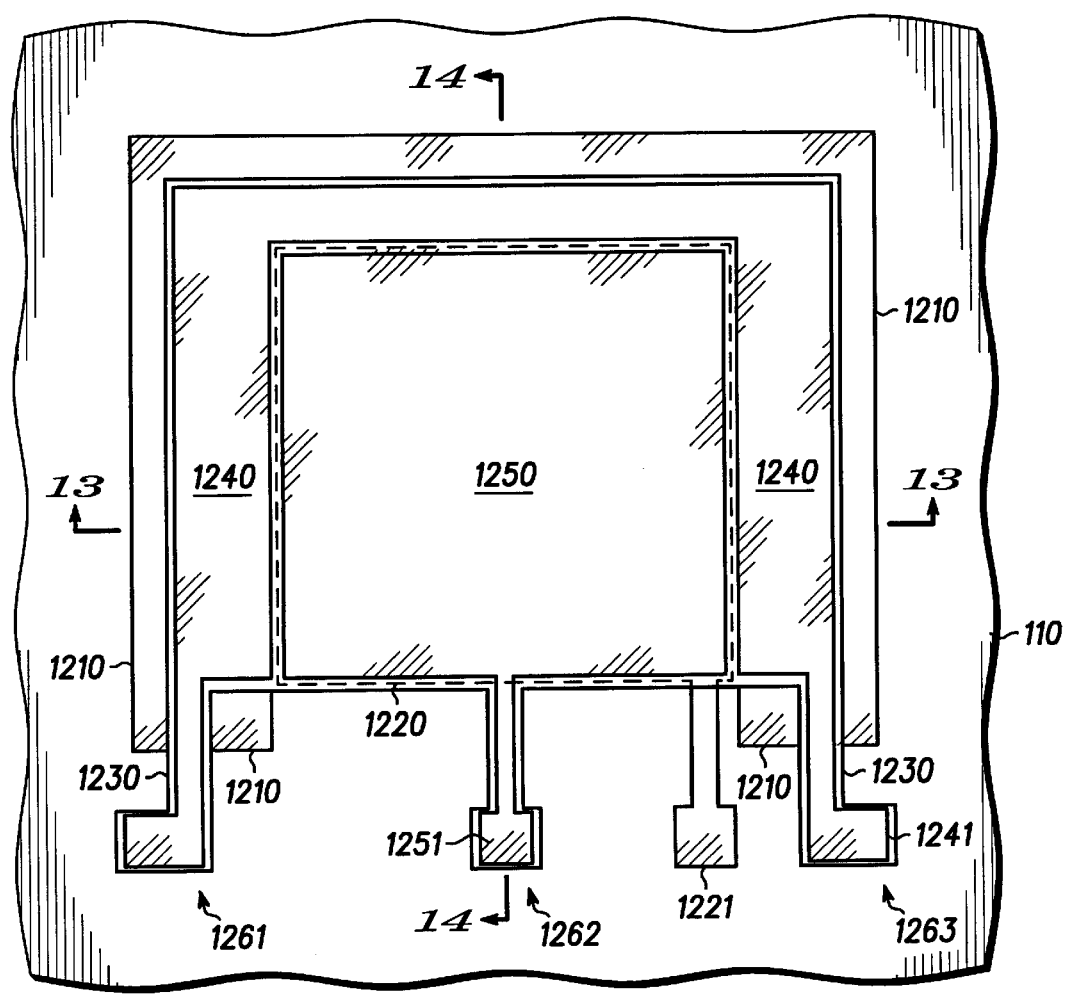
FIG. 12 illustrates a top view of a third capacitive device in accordance with an embodiment of the invention.
Figure 13:
FIG. 13 illustrates a cross-sectional view of the third capacitive device of FIG. 12, taken along a section line 13—13 in FIG. 12, in accordance with an embodiment of the invention.
Figure 14:
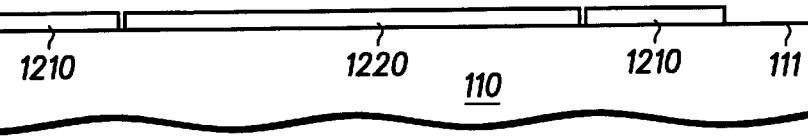
FIG. 14 illustrates a cross-sectional view of the third capacitive device of FIG. 12, taken along a section line 14—14 in FIG. 12, in accordance with an embodiment of the invention.
Figure 14:
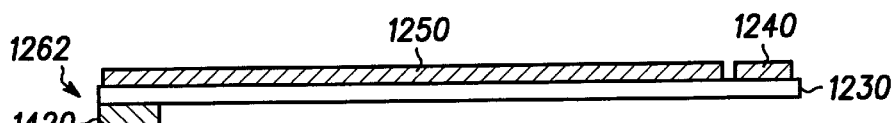

FIG. 12 illustrates a top view of a capacitive device 1200, which is a different embodiment of capacitive device 100 in FIG. 1. FIG. 13 illustrates a cross-sectional view of capacitive device 1200, taken along a section line 13—13 in FIG. 12, and FIG. 14 illustrates a cross-sectional view of device 1200, taken along a section line 14—14 in FIG. 12. Device 1200 operates in a manner similar to device 100 in FIG. 1. Accordingly, device 1200 preferably has only two states: an on-state and an off-state.

Device 1200 includes substrate 110 having surface 111, and device 1200 also includes electrodes 1210 and 1220 located over surface 111 of substrate 110 and located adjacent to each other. Electrode 1210 surrounds or wraps around three sides or a majority of electrode 1220. Electrodes 1210 and 1220 are electrically isolated from each other.

Device 1200 also includes electrodes 1240 and 1250. Electrode 1240 overlies electrode 1210, and electrode 1250 overlies electrode 1220. Electrodes 1240 and 1250 are electrically isolated from each other. Electrodes 1240 and 1250 are moveable relative to electrodes 1210 and 1220, respectively. Electrodes 1210 and 1240 are capacitively coupled to each other, and electrodes 1220 and 1250 are capacitively coupled to each other.

Device 1200 further includes an electrically insulative layer 1230 located between electrodes 1240 and 1210 and also between electrodes 1250 and 1220. Layer 1230 supports electrodes 1240 and 1250 above electrodes 1210 and 1220, respectively. Device 1200 additionally includes anchors 1261, 1262, and 1263 supporting layer 1230 and electrodes 1240 and 1250 above surface 111 of substrate 110 and above electrodes 1210 and 1220. Anchors 1261, 1262, and 1263 are each comprised of different portions of layers 1410 and 1420, which are similar to layers 410 and 610, respectively, in FIGS. 5, 6, 7, and 8. Anchors 1261, 1262, and 1263 are located only at one side of electrode 1250.

Device 1200 additionally includes output terminal leads 1221 and 1251. Output terminal lead 1221 is coupled to electrode 1220, and output terminal lead 1251 is coupled to electrode 1250. Lead 1221 and electrode 1220 serve as a first signal feed through line, and lead 1251 and electrode 1250 serve as a second signal feed through line.

Unlike device 100 of FIG. 1, device 1200 of FIG. 12 preferably does not include a movable, electrically floating electrode. Instead, device 1200 of FIG. 12 preferably electrically biases the movable electrode. The moveable, electrically floating electrode of the three-plate capacitive system in device 100 of FIG. 1 simplifies the complexity of signal feeding through electrical lines compared to the two-plate capacitive system of device 1200 in FIG. 12. However, the two-plate capacitive system of device 1200 in FIG. 12 makes more effective use of the capacitive plate area compared to the three-plate capacitive system of device 100 in FIG. 1.

Therefore, an improved capacitive device and method of manufacturing is provided to overcome the disadvantages of the prior art. The capacitive devices have wide range capacitance tuning, high quality factors, high tuning accuracy, high RF, AC, and DC isolation, and low power consumption. The methods of manufacturing the capacitive devices are compatible with the manufacturing processes for both silicon and gallium arsenide integrated circuits.

Although the invention has been described with reference to specific embodiments, it will be understood by those skilled in the art that various changes may be made without departing from the spirit or scope of the invention. For instance, the numerous details set forth herein such as, for example, the material compositions, the layer thicknesses, and the shapes and sizes of the electrodes are provided to facilitate the understanding of the invention and are not provided to limit the scope of the invention. Accordingly, the disclosure of embodiments of the invention is intended to be illustrative of the scope of the invention and is not intended to be limiting. It is intended that the scope of the invention shall be limited only to the extent required by the appended claims.

What is claimed is:
1. A capacitive device comprising:
  a substrate;

a first electrode located over the substrate;

a second electrode located over the substrate;

a third electrode located over the first electrode, movable relative to the first electrode, and capacitively coupled to the first electrode;

a fourth electrode located over the second electrode, movable relative to the second electrode, and capacitively coupled to the second electrode, wherein:
the first and third electrodes actuate the fourth electrode toward the second electrode; and a fifth electrode located over the substrate, wherein:
the fourth electrode is located over the fifth electrode, movable relative to the fifth electrode, and capacitively coupled to the fourth electrode; and
the second electrode is capacitively coupled to the fifth electrode via the fourth electrode.

2. The capacitive device of claim 1 further comprising:

a sixth electrode located over the substrate;

rip a seventh electrode located over the sixth electrode, movable relative to the sixth electrode, and capacitively coupled to the sixth electrode, wherein:
the sixth and seventh electrodes actuate the fourth electrode toward the second and fifth electrodes.

3. The capacitive device of claim 2 wherein:

the first and sixth electrodes are electrically coupled together; and the third and seventh electrodes are electrically coupled together.

4. The capacitive device of claim 1 further comprising:

an electrically insulative layer supporting the third electrode over the first electrode and supporting the fourth electrode over the second electrode.

5. The capacitive device of claim 1 wherein:

the first and third electrodes move in a first direction to actuate the fourth electrode in the first direction.

6. The capacitive device of claim 1 wherein:

the first and third electrodes move in a first direction to tune a capacitance between the second and fourth electrodes.

7. The capacitive device of claim 6 wherein:

the capacitance between the second and fourth electrodes has two discrete states.

8. The capacitive device of claim 7 wherein:

a gap is located between the first and third electrodes and between the second and fourth electrodes during a first one of the two discrete states; and the capacitive device is devoid of the gap during a second one of the two discrete states.

9. The capacitive device of claim 1 wherein:

the first, second, third, and fourth electrodes form a switch.

10. A capacitive tuning device comprising:

a semiconductor substrate having a surface;

a first electrode located over the surface of the semiconductor substrate;

a second electrode located over the surface of the semiconductor substrate, located adjacent to the first electrode, and electrically isolated from the first electrode;

a third electrode located over the first electrode, movable relative to the first electrode, electrically isolated from the second electrode, and capacitively coupled to the first electrode;

a fourth electrode located over the second electrode, located adjacent to the third electrode, movable relative to the second electrode, electrically isolated from the first and third electrodes, and capacitively coupled to the second electrode;

an electrically insulative layer located between the first and third electrodes, supporting the third electrode over the first electrode, located between the second and fourth electrodes, and supporting the fourth electrode over the second electrode, wherein:
the first and third electrodes actuate the fourth electrode toward the second electrode; and a fifth electrode located over the surface of the semiconductor substrate, located adjacent to and between the first and second electrodes, and electrically isolated from the first electrode, wherein:
the fourth electrode is located over the fifth electrode, movable relative to the fifth electrode, and capacitively coupled to the fourth electrode;
the electrically insulative layer is located between the fifth and fourth electrodes and supports the fourth electrode over the fifth electrode; and
the second electrode is capacitively coupled to the fifth electrode via the fourth electrode.

11. The capacitive tuning device of claim 10 further comprising:

a sixth electrode located over the surface of the semiconductor substrate, located adjacent to the second electrode, and electrically isolated from the second electrode;

a seventh electrode located over the sixth electrode, located adjacent to the fourth electrode, movable relative to the sixth electrode, electrically isolated from the fourth electrode, and capacitively coupled to the sixth electrode, wherein:
the electrically insulative layer is located between the sixth and seventh electrodes and supports the seventh electrode over the sixth electrode; and
the sixth and seventh electrodes actuate the fourth electrode toward the second and fifth electrodes.

12. The capacitive tuning device of claim 11 wherein:

the first and sixth electrodes are electrically coupled together; and the third and seventh electrodes are electrically coupled together.

* * * * *

UNITED STATES PATENT AND TRADEMARK OFFICE
CERTIFICATE OF CORRECTION

PATENT NO. : 6,507,475 B1
DATED : January 14, 2003
INVENTOR(S) : Xi-Qing Sun

It is certified that error appears in the above-identified patent and that said Letters Patent is hereby corrected as shown below:

<u>Column 9,</u>
Line 22, delete "rip".

Signed and Sealed this

Twentieth Day of January, 2004

JON W. DUDAS
*Acting Director of the United States Patent and Trademark Office*